United States Patent
Lartigue

(10) Patent No.: US 11,946,955 B2
(45) Date of Patent: Apr. 2, 2024

(54) SENSOR WHICH SENSES THE INSTANTANEOUS RATE OF CHANGE OF A CURRENT, SAID SPEED SENSOR BEING GALVANICALLY ISOLATED AND INTEGRATED ON A PRINTED CIRCUIT BOARD

(71) Applicants: NL CONSEIL, Le Plessis-Robinson (FR); SAFRAN ELECTRICAL & POWER, Blagnac (FR)

(72) Inventor: Norbert Lartigue, Le Plessis-Robinson (FR)

(73) Assignees: NL CONSEIL, Le Plessis-Robinson (FR); SAFRAN ELECTRICAL & POWER, Blagnac (FR)

( * ) Notice: Subject to any disclaimer, the term of this patent is extended or adjusted under 35 U.S.C. 154(b) by 924 days.

(21) Appl. No.: 16/964,137

(22) PCT Filed: Jan. 31, 2019

(86) PCT No.: PCT/EP2019/052429
§ 371 (c)(1),
(2) Date: Jul. 22, 2020

(87) PCT Pub. No.: WO2019/149846
PCT Pub. Date: Aug. 8, 2019

(65) Prior Publication Data
US 2021/0033647 A1 Feb. 4, 2021

(30) Foreign Application Priority Data

Jan. 31, 2018 (FR) .................................... 1850773
Feb. 23, 2018 (FR) .................................... 1851598

(51) Int. Cl.
*G01R 19/12* (2006.01)
*G01R 15/18* (2006.01)
(Continued)

(52) U.S. Cl.
CPC ............ *G01R 19/12* (2013.01); *G01R 15/181* (2013.01); *H01F 27/2804* (2013.01); *H02K 3/12* (2013.01)

(58) Field of Classification Search
CPC ....... G01R 19/12; G01R 15/181; G01R 19/00; G01R 15/00; G01R 15/14; G01R 15/18;
(Continued)

(56) References Cited

U.S. PATENT DOCUMENTS 5,459,395 A * 10/1995 Berkcan ............... G01R 15/207
338/49
5,642,041 A * 6/1997 Berkcan ............... G01R 15/207
324/117 R
(Continued)

FOREIGN PATENT DOCUMENTS

CN 103134967 A * 6/2013 ........... G01R 15/181
CN 111837043 A * 10/2020 ........... G01R 15/181
(Continued)

OTHER PUBLICATIONS

Written Opinion of the International Searching Authority dated Apr. 8, 2019, issued in corresponding International Application No. PCT/EP2019/052429, filed Jan. 31, 2019, 5 pages.
(Continued)

*Primary Examiner* — Hoai-An D. Nguyen
(74) *Attorney, Agent, or Firm* — CHRISTENSEN O'CONNOR JOHNSON KINDNESS PLLC

(57) ABSTRACT

A sensor is configured to sense the rate of change of a current in order to protect the bridge arms in a power module with power layers and measurement layers. The sensor includes at least three conductors (C1, C2, Cp) and coils. One end of each conductor is connected to a common node, while the other end of each conductor is used respectively as an electrical terminal. The at least three conductors are con-
(Continued)

tained in the same plane, referred to as the primary plane, while each conductor has a plane of symmetry perpendicular to the primary plane, each plane of symmetry passing through the common node and the corresponding terminal. A first conductor and a second conductor are identical and positioned symmetrically relative to a third conductor, and at least one pair of coils is positioned symmetrically relative to a plane of symmetry.

10 Claims, 3 Drawing Sheets

(51) Int. Cl.
  *H01F 27/28* (2006.01)
  *H02K 3/12* (2006.01)
(58) Field of Classification Search
  CPC .... H01F 27/2804; H01F 38/28; H01F 27/427; H01F 27/00; H01F 27/28; H02K 3/00; H02K 3/02; H02K 3/04; H02K 3/12
  USPC ........ 324/117 R, 126–127, 656, 66; 307/131
  See application file for complete search history.

(56) References Cited

U.S. PATENT DOCUMENTS

| | | | | |
|---|---|---|---|---|
| 5,777,417 A * | 7/1998 | Haldemann | | H02K 3/14 |
| | | | | 310/201 |
| 6,822,547 B2 * | 11/2004 | Saito | | H01F 38/30 |
| | | | | 336/200 |
| 7,564,233 B2 * | 7/2009 | Kojovic | | G01R 15/181 |
| | | | | 324/117 R |
| 7,902,812 B2 * | 3/2011 | Kojovic | | H01F 38/30 |
| | | | | 324/117 R |
| 7,990,132 B2 * | 8/2011 | Dupuis | | G01R 15/181 |
| | | | | 324/117 R |
| 8,378,662 B2 * | 2/2013 | Storkey | | G01R 15/181 |
| | | | | 324/127 |
| 10,041,978 B2 * | 8/2018 | Salles | | H01L 25/065 |
| 10,103,551 B2 * | 10/2018 | Hopperdietzel | ... | H03K 17/0828 |
| 10,218,185 B2 * | 2/2019 | Hopperdietzel | ..... | H03K 17/165 |
| 10,224,722 B2 * | 3/2019 | Hopperdietzel | ..... | G01R 15/183 |
| 10,274,521 B2 * | 4/2019 | Cook | | G01R 15/181 |
| 10,859,605 B2 * | 12/2020 | Hurwitz | | G01R 3/00 |
| 11,740,262 B2 * | 8/2023 | Guðmundsson | ..... | G01R 15/181 |
| | | | | 324/76.11 |
| 2003/0090356 A1 * | 5/2003 | Saito | | G01R 19/2513 |
| | | | | 336/213 |
| 2004/0055395 A1 * | 3/2004 | Tankard | | H02K 11/00 |
| | | | | 73/862 |
| 2006/0038552 A1 * | 2/2006 | Omura | | G01R 31/2644 |
| | | | | 324/117 R |
| 2008/0106253 A1 * | 5/2008 | Kojovic | | H01F 5/003 |
| | | | | 336/229 |
| 2009/0230948 A1 * | 9/2009 | Kojovic | | H01F 38/30 |
| | | | | 336/174 |
| 2010/0109643 A1 * | 5/2010 | Storkey | | G01R 15/181 |
| | | | | 324/117 R |
| 2010/0176793 A1 * | 7/2010 | Michalak | | G01R 31/2884 |
| | | | | 324/117 H |
| 2011/0043190 A1 * | 2/2011 | Farr | | H01F 27/289 |
| | | | | 336/84 R |
| 2014/0306551 A1 * | 10/2014 | Jost | | G01R 31/002 |
| | | | | 324/656 |
| 2015/0204914 A1 * | 7/2015 | Fujii | | G01R 35/005 |
| | | | | 324/207.17 |
| 2015/0369845 A1 * | 12/2015 | Salles | | G01R 3/00 |
| | | | | 29/595 |
| 2017/0040802 A1 * | 2/2017 | Hopperdietzel | .......... | H02J 4/00 |
| 2017/0059620 A1 * | 3/2017 | Cook | | G01R 15/181 |
| 2017/0104338 A1 * | 4/2017 | Hopperdietzel | ..... | H03K 17/165 |
| 2017/0104339 A1 * | 4/2017 | Hopperdietzel | ..... | H03K 17/165 |
| 2017/0356935 A1 * | 12/2017 | Hurwitz | | G01R 19/12 |
| 2021/0033647 A1 * | 2/2021 | Lartigue | | G01R 15/181 |
| 2023/0058565 A1 * | 2/2023 | Gudmundsson | ..... | G01R 15/181 |

FOREIGN PATENT DOCUMENTS

| | | | | |
|---|---|---|---|---|
| FR | 3077390 A1 * | 8/2019 | ............ | G01R 19/12 |
| JP | 2003279600 A | * 10/2003 | | |
| JP | 2020204524 A | * 12/2020 | | |
| KR | 20230021884 A | * 2/2023 | | |
| WO | WO-2019149846 A1 * | 8/2019 | ........... | G01R 15/181 |

OTHER PUBLICATIONS

International Preliminary Report on Patentability dated Aug. 4, 2020, issued in corresponding International Application No. PCT/EP2019/052429, filed Jan. 31, 2019, 1 page.
International Search Report dated Apr. 8, 2019, issued in corresponding International Application No. PCT/EP2019/052429, filed Jan. 31, 2019, 7 pages.

* cited by examiner

SENSOR WHICH SENSES THE INSTANTANEOUS RATE OF CHANGE OF A CURRENT, SAID SPEED SENSOR BEING GALVANICALLY ISOLATED AND INTEGRATED ON A PRINTED CIRCUIT BOARD

FIELD OF THE DISCLOSURE

The present disclosure relates to a sensor which senses the instantaneous rate of change of current integrated in a printed circuit. It relates more particularly to an improvement of a sensor of the air transformer type comprising conductors and coils. This sensor is particularly suitable for measuring on bridge arm currents of a power module and for their protection. Referring to the topology of electrical circuits, it addresses in particular the measurement of currents at the nodes of several conductors.

BACKGROUND

The conversion of energy into power electronics is changing rapidly. This dynamism is driven by the various revolutions taking place in the automotive (hybrid and all-electric vehicles, charging stations), railway (increased level of integration of train electronics, new and more energy-efficient substations), aeronautics (aircraft that are more electric), space (arrival of digital technology in energy conversion), industry (improving the energy efficiency of plants where you connect to the network without a converter . . . ), energy (integration of renewable energies, super-grid, micro-grid) sectors.

This new development in power electronics is made possible by new technologies of power modules, such as insolated gate bipolar transistor (IGBT) and wide-gap semiconductors such as GaN and SiC, which have increased the efficiency and integration levels of the "electrified functions". On the other hand, the temperature inside these modules is peaking (>125° C., up to 255° C.).

The power modules consist of bridge arms, whose switching times become very short thanks to the "wide gap" components. Typically, 100 A is switched off in 10 ns. As a consequence, design rules must allow to reduce parasitic inductances, in order to limit overvoltages and to reduce the energies trapped in the inductive elements of the switched circuits.

However, there may still be a defect in the arm and/or in the load, which must be sensed before prohibitive overcurrents are reached. Consequently, it is necessary to have a current sensor configured to measure extremely rapid temporal variations of currents as soon as they are established, particularly in the bridge arms of static energy converters, in order to anticipate the sensing of a defect; the sensor will naturally have to thermally and mechanically resist these fault currents. The defect must typically be sensed in a few hundred nanoseconds as soon as the defect occurs and before the subsequent establishment of prohibitive overcurrents in order to be able to open the electrical circuit of the arm in a delay typically less than 1 µs. This current sensor must not introduce a parasitic inductance with a value greater than a few Nh.

A current sensor known from U.S. Pat. No. 7,990,132 comprises coils located inside the integrated circuit chip and are inductively coupled to a conductor located inside the circuit package. The inductances sense the current in the conductor and provide the sensed signal to an integrator which provides a voltage indicative of the current in the conductor.

A current sensing equipment known from the document US20060038552, comprises a first coil and a second coil connected in series with the first coil. The current sensing equipment is configured to sense a current flowing through an object that is provided between the first and second coils or provided near the first or second coil. Each of the first and second coils having first conductive patterns provided on a surface of a substrate, second conductive patterns provided on a back of the substrate, and connecting pieces that connect the first and second conductive patterns. A semiconductor device comprising current sensing equipment for measuring the current flowing in a semiconductor element is also provided.

It is obvious to a person skilled in the art to find a three-dimensional topology, for example by orienting the three terminals in the three axes of a three-dimensional orthonormal frame. A field measurement can be made in each of the planes of the frame and thus benefit from a relative immunity between the three currents of the three terminals. However, this principle is very difficult and costly to implement in practice, and in particular with regard to the constraints of optimizing the length of conductors required for the imperative minimization of parasitic inductances.

It is desirable to solve several problems such as:
measuring simultaneously and separately the di/dt developed in a bridge arm and in its load,
have a direct physical measurement of the rate of change of current to allow rapid processing of the raw information as free of noise as possible.
minimise any parasitic inductance introduced into the switching circuit,
have a very short response time,
be very compact, ideally integrated into a printed circuit board (PCB) and be compatible with a model, the components of which are mounted on the surface,
be insensitive to very strong Dv/dt,
ensure galvanic isolation,
be immune to electromagnetic disturbances, in particular crosstalk generated by the other bridge arms (in the case of a full bridge or a three-phase bridge for example) and by other neighbouring power circuits.

SUMMARY

In order to achieve at least one of these purposes, the object of the disclosure provides a sensor which senses the rate of change of a current comprising at least three conductors (C1, C2, Cp) and coils. The sensor furthermore has the characteristics as described below:
one end of each of the conductors is connected to a common node (N),
and the other end of each of the conductors is used respectively each as an electrical terminal (T1, T2, Tp),
the at least three conductors are contained in a single plane, called the primary plane (P),
each conductor (C1, C2, Cp) has a plane of symmetry (P1, P2, Pp) perpendicular to the primary plane, each plane of symmetry passing through the common node (N) and the corresponding terminal (T1, T2, Tp),
a first conductor (C1) and a second conductor (C2) are identical and positioned symmetrically with respect to a third conductor (Cp),
at least one pair of coils are positioned symmetrically with respect to a plane of symmetry (P1, P2, Pp).

According to other advantageous and non-limiting characteristics of the disclosure, taken alone or in any technically feasible combination:
- at least two planes of symmetry coincide,
- the first conductor and the second conductor are aligned and the distance between the corresponding terminals is minimal,
- one of the coils of the third conductor is common with one of the coils of the first conductor, and the other of the coils of the third conductor is common with one of the coils of the second conductor,
- the conductors are in a rectilinear and flat shape,
- the conductors are multilayer or striated,
- the conductors (C1, C2, Cp) and the coils are made of a multilayer printed circuit,
- the conductors (C1, C2, Cp) are multi-track and multi-layer with a "Roebel bar" topology commonly used in electrical machines to reduce the eddy currents that cause the increase in internal resistance and inductance of high-frequency conductors.
- the described topology has the effect of positioning a virtual conductive layer equivalent with respect to magnetic phenomena in the mid-thickness zone of the conductor plane,
- the sensor comprises electrostatic shields etched in a multilayer printed circuit and connected to a fixed potential between the power layers and measurement layers,
- the shields are etched so as to judiciously channel the eddy currents,
- All the power layers are gathered in a plane at a first level, and all measurement layers are gathered in a plane at a second level, the first level being either above or below the second level.

DESCRIPTION OF THE DRAWINGS

Other characteristics and advantages of the disclosure will be shown in the detailed description of the disclosure which will follow with reference to the annexed figures on which.

DETAILED DESCRIPTION

In order to simplify the description below, the same references are used for identical elements or elements performing the same function in the different variants of the described device.

Example of Embodiment for the Measurement of Three Currents

Figure 1:
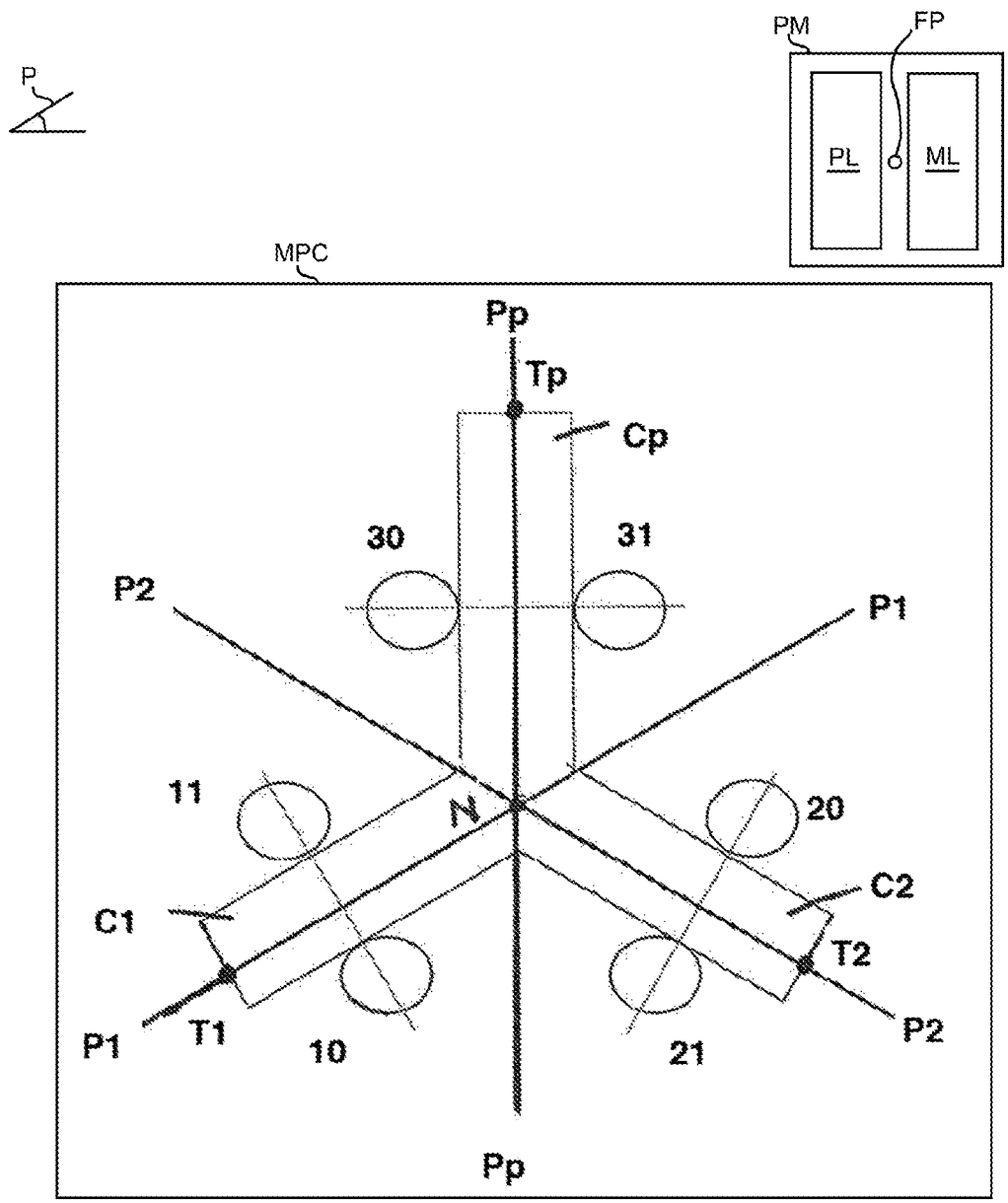
FIG. 1 represents a schematic view of a sensor which senses the instantaneous rate of change of a current for the measurement of three currents.

FIG. 1 illustrates a first embodiment of a sensor for the instantaneous measurement of three instantaneous rates of change of currents in a three-pole structure. It is a sensor which senses the instantaneous rate of change of a current comprising three conductors C1, C2, Cp. One end of each conductor is connected to a common node N, while the other end of each conductor is defined as an electronic terminal T1, T2, Tp. We note the three terminals Tp, T1 and T2 through which the currents Ip, I1 and I2 flow.

All three conductors are substantially contained in the same plane, which is on the paper plane, called the primary plane. In addition, a plane of symmetry Pp is defined for the conductor Cp, which crosses the line between the node N and terminal Tp, and which is perpendicular to the primary plane. A pair of coils 30 and 31 is positioned symmetrically with respect to the plane Pp and each on one side of the conductor Cp. In the same way, symmetry planes P1 and P2 perpendicular to the primary plane are defined with respect to the conductors C1 and C2 respectively, the symmetry plane P1 passing through the line between the node N at the terminal T1, the symmetry plane P2 passing through the line between the node N at the terminal T2.

A pair of coils 10 and 11 is positioned symmetrically with respect to the plane P1 and each on one side of the conductor C1, while a pair of coils 20 and 21 is positioned symmetrically with respect to the plane P2 and each on one side of the conductor C2. In each pair of coils, one is wired in the left direction and the other in the right direction, these coils are called: Sp1D 10, Sp1G 11, Sp2D 20, Sp2G 21, SppD 30 and SppG 31.

For example, the measurement of the instantaneous rate of change of the current Ip, independently of the value of I1 and I2, is obtained by means of the electromotive force delivered by the coil consisting of the following combinations:
- SppD in series, SppG in anti-series
- Sp1G in anti-series, Sp1D in anti-series
- Sp2G in series, Sp2D in series In the same way, the value of the instantaneous rate of change of I1 is obtained independently of the 2 other currents respectively via the following combinations:
- SppD in anti-series, SppG in anti-series
- Sp1G in anti-series, Sp1D in series
- Sp2G in series, Sp2D in series And for the rate of change of I2:
- SppD in anti-series, SppG in anti-series
- Sp1G in series, Sp1D in series
- Sp2G in series, Sp2D in anti-series In this case of embodiment, the circular coils are given as an illustration but not as a limitation.

Figure 2:
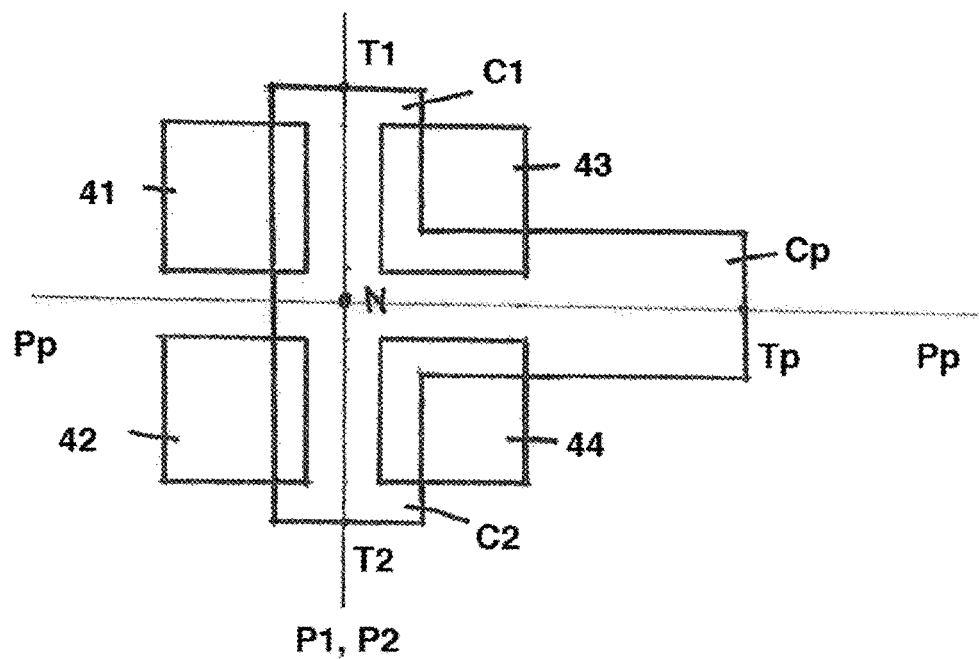
FIG. 2 represents a schematic view of a sensor which senses the instantaneous rate of change of a current for measuring the bridge arms current and the phase current of a bridge type converter topology.

Example of a sensor which senses the instantaneous rate of change of a current for a bridge arm current and a phase current FIG. 2 illustrates a second embodiment of a sensor to measure the instantaneous rate of change of a current of a bridge arm current and a phase current. It is a current sensor comprising three conductors C1, C2, Cp. The conductors C1 and C2 are identical, aligned and positioned symmetrically and perpendicularly with respect to the conductor Cp. One end of each conductor is connected to a common node N, while the other end of each conductor is defined as an electrical terminal T1, T2, Tp. A current I1 flows through the terminal T1, the current I2 flows through the terminal T2 and the current Ip flows through the terminal Tp. By definition the currents are incoming.

All the three conductors are contained in the same plane, which is on the paper plane, called the primary plane. In a similar way as in the first embodiment, three planes of symmetry P1, P2 and Pp perpendicular to the primary plane are also defined for each conductor C1, C2 and Cp. When the conductors C1 and C2 are aligned, the symmetry planes P1 and P2 merge.

A pair of coils 43 and 44 is positioned symmetrically with respect to the plane Pp and each on one side of the conductor Cp. Each of the conductors C1 and C2 has a coil 41 and 42 respectively on its side. By symmetry, the pair of coils 41 and 43 are positioned symmetrically with respect to the plane P1 and each on one side of the conductor C1, while the pair of coils 42 and 44 are positioned symmetrically with respect to the plane P2 and each on one side of the conductor C2.

The four coils are oriented by definition in a direction perpendicular to the primary plane, with a positive flow going up the paper.

The coils are shown with a square shape for illustrative but not limiting purposes. They can be rectangular, circular, etc. as long as they respect the symmetry.

Twelve mutual inductances are introduced between the circuits C1, C2 and Cp and each of the four coils, denoted Mxxy, with xx representing the coil and y representing the current. The values of the inductances are positive by definition.

The flux in each coil can be calculated by superposition and the following equations can be written:

Phi1D=−M1D1·I1+M1D2·I2−M1Dp·Ip

PhipD=MpD1·I1−MpD2·I2−MpDp·Ip

PhipG=MpG1·I1−MpG2·I2+MpGp·Ip

Phi2G=−M2G1·I1+M2G2·I2+M2Gp·Ip

Thanks to the construction symmetries, the set of equations can be simplified.

Indeed, due to the symmetry of the coils with respect to the plane Pp, we have the properties:

MpGp=MpDp=Mpp

M2Gp=M1Dp=Mip

Indeed, due to the symmetry of the coils with respect to the plane P1, we have the properties:

M1D1=MpD1=Mii

M2G1=MpG1=Mij

Indeed, due to the symmetry of the coils with respect to the plane P2, we have the properties:

M2G2=MpG2=Mii

M1D2=MpD2=Mji

Furthermore, thanks to the symmetry of the conductors C1 and C2 with respect to the plane Pp, we add the property Mij=Mji We end up with a system of 4 equations with only 4 manufacturing parameters, noted Mii, Mji and Mpp, Mip. Namely:

Phi1D=−Mii·I1+Mji·I2−Mip·Ip

PhipD=+Mii·I1−Mji·I2−Mpp·Ip

PhipG=+Mji·I1−Mii·I2+Mpp·Ip

Phi2G=−Mji·I1+Mii·I2+Mip·Ip

The IMC common mode current and the IMD differential mode current are defined as follows:

$$IMC = \frac{I1 + I2}{2}$$

$$IMD = \frac{I1 - I2}{2}$$

Thus $I_1 = IMC + IMD$

And $I_2 = IMC - ID$

As a reminder, the law of nodes is: $Ip = -I_2 - I_2$

Thus $Ip = -2IMC$

Thus we can see that the phase current is an image of the common mode current, while the arm current is an image of the differential mode current.

It should also be remembered that the electromotive force at the terminals of a coil is proportional to the derivative with respect to the time of the collected flux. Thus, a voltage difference appears at the terminals of the coils, directly proportional to the rate of change of the neighbouring currents at the origin of the fluxes.

Let's rewrite the flux equations to show the two currents IMC and IMD:

Phi1D=−Mii·(IMC+IMD)+Mji·(IMC−IMD)+ 2Mip·IMC

PhipD=+Mii·(IMC+IMD)−Mji·(IMC−IMD)+ 2Mpp·IMC

PhipG=+Mji·(IMC+IMD)−Mii·(IMC−IMD)− 2Mpp·IMC

Phi2G=−Mji·(IMC+IMD)+Mii·(IMC−IMD)− 2Mip·IMC

Let's now calculate the flux of the SpMC coil consisting of the following combination:
Sp1D in series
SppD in anti-series
SppG in series
Sp2G in anti-series This combination is interesting because it consists of a double differential pair, which therefore particularly rejects all the flux from external fields.

We obtain a complete flux, noted PhiMC, as follows:

$$PhiMC = -Mii \cdot (IMC + IMD) + Mji \cdot (IMC - IMD) +$$
$$2\, Mip \cdot IMC - Mii \cdot (IMC + IMD) + Mji \cdot (IMC - IMD) -$$
$$2\, Mpp \cdot IMC + Mji \cdot (IMC + IMD) - Mii \cdot (IMC - IMD) -$$
$$2\, Mpp \cdot IMC + Mji \cdot (IMC + IMD) - Mii \cdot (IMC - IMD) + 2\, Mip \cdot IMC$$
$$PhiMC = -2Mii \cdot (IMC + IMD) + 2Mji \cdot (IMC - IMD) +$$
$$4Mip \cdot IMC + 2Mji \cdot (IMC + IMD) - 2Mii \cdot (IMC - IMD - 4Mpp \cdot IMC$$
$$PhiMC = IMC \cdot (-2Mii + 2Mji + 4Mip - 4Mpp + 2Mji - 2Mii) +$$
$$IMD \cdot (-2Mii - 2Mji + 2Mji + 2Mii)$$
$$PhiMC = IMC \cdot (-4Mii + 4Mji + 4Mip - 4Mpp)$$
$$PhiMC = 2Ip \cdot (-Mii + Mji + Mip - Mp)$$

PhiMC does not depend on differential mode current (IMD), which is the image of the arm current, but only on common mode current (IMC), which is the image of the phase current. Thus, this topology allows the phase current to be accessed independently of the arm current.

Now let's calculate the flux of the SpMD spiral consisting of the following combination:

Sp1D in series
SppD in anti-series
SppG in anti-series
Sp2G in series

This combination is interesting because it consists of a differential pair, which rejects well the influence of external fields.

We obtain a complete flux, noted PhiMD, as follows:

$$PhiMD = -Mii \cdot (IMC + IMD) + Mji \cdot (IMC - IMD) +$$
$$2Mip \cdot IMC - Mii \cdot (IMC + IMD) + Mji \cdot (IMC - IMD) -$$
$$2Mpp \cdot IMC - Mji \cdot (IMC + IMD) + Mii \cdot (IMC - IMD) +$$
$$2Mpp \cdot IMC - Mji \cdot (IMC + IMD) + Mii \cdot (IMC - IMD) - 2Mip \cdot IMC$$
$$PhiMD = +4(Mji + Mii) \cdot IMD$$
$$PhiMD = +2(Mji + Mii) \cdot (I1 - I2)$$

PhiMD does not depend on common mode current (IMC), which is the image of phase current, but only on differential mode current (IMD), which is the image of arm current. Thus, this topology allows the arm current to be accessed independently of the phase current.

Figure 3:
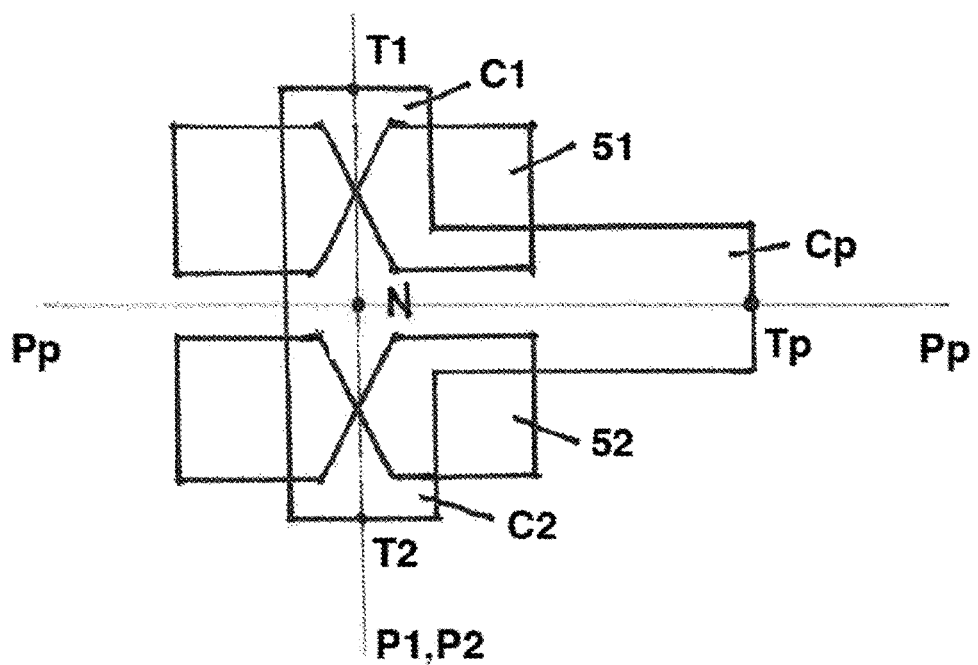
FIG. 3 represents a schematic view of a sensor which senses the instantaneous rate of change of a current for measuring the bridge arms current.

Example of a sensor which senses the instantaneous rate of change of bridge arms current FIG. 3 illustrates a third embodiment of a sensor to measure the instantaneous rate of change of bridge arms current and phase current. The conductors are the same as those of the second embodiment. A pair of coils 51 and 52 is positioned symmetrically with respect to the planes P1, P2 and Pp, and each on one side of conductor Cp. In this example, only the phase current is measured, independently of the bridge arm current.

The following paragraphs introduce several variants of the sensor which senses the instantaneous rate of change of a current based on the above-mentioned main structure.

First, a configuration is considered which introduces a very low parasitic inductance into the switching circuit.

If the phase current is considered to be Ip, only the inductance between the terminals 1 and 2 is involved in the switching behaviour of a bridge arm. This inductance value can be preferred, in which case the distance between the terminals 1 and 2 and the node can be reduced. In this configuration, the distance between the terminals T1 and T2 is minimal in order to reduce the inductance. Therefore, it is not possible to separate the currents I1 and I2. When wide and short conducting tracks on the printed circuit board are preferred, while maintaining symmetry, low inductance values are achieved, typically less than 10 nH or even 5 nH, 2 nH or even 1 nH.

Although the possibility of independently measuring the currents of the two half arms T1-Tp and T2-Tp is lost, the arm and phase current can still be obtained.

For an other embodiment, a very short response time is desirable, typically less than 300 ns or even 100 ns. In order to reduce the response time, the time constants introduced by skin and proximity effect should be kept to a minimum. For this purpose, electrical conductors C1, C2 and Cp are preferred as primary conductors, which are made of multi-layers, with each of the layers insulated from each other. A multilayer PCB is a good example for the realization of primary conductors.

In addition, for each layer, the conductors can be striated. Thus, the primary conductors C1, C2 and Cp are multilayer and/or striated.

In addition, the conductors C1, C2 and Cp can be produced in a Roebel bar topology, which represents a special division of a rod-like electrical conductor into a plurality of parallel, mutually insulated and laminated subconductors. This topology allows the conductors to behave as a single planar conductor overall, and considerably reduces the effects of eddy currents on the resistance and inductance values of the conductors at high frequencies.

In another respect, the disclosure provides a sensor which senses the instantaneous rate of change of a compact current, ideally integrated in a printed circuit. Here, the primary conductors C1, C2 and CP are produced by etching tracks on a printed circuit board (PCB). In order to master the rules of symmetry, the sensor coils are also made on the same PCB with distant layers.

Several sensor coils, as described above, can be used to directly deliver the induced electromotive forces (e.m.f.) without the need for post-processing. This will provide a layer for the coil delivering the e.m.f. proportional to the instantaneous rate of change of the phase current and another layer for the coil delivering the induced e.m.f. image of the instantaneous rate of change of the bridge arm current. The conductors C1, C2 and Cp as well as the windings are made of multilayer PCB.

In yet another aspect, the disclosure provides a sensor which senses the instantaneous rate of change of a current compatible with a surface mount device (SMD) model.

All that is required is to locate all the layers of the power PCB under the measurement layers. The power tracks are grouped in essentially the same plane and the measurement tracks in one and the same parallel plane, either above or below.

In one particular aspect, the disclosure provides a current sensor that is immune to very high dV/dt, typically greater than 10 kV/µs or even 100 kV/1 µs or even 1 MV/µs.

The voltage at the middle points of the bridge arm is subject to very high dV/dt with respect to the cold point of the potentials. As a result, currents can be injected into the sensor electronics by capacitive effect. In principle, these are common-mode currents due to the common-mode potential variations of the middle point of the arms with respect to the cold point of the DC source supplying the bridge converter. Thus, the interest of using a differential measurement appears in order to eliminate the effects of these currents on the measurement. However, there is still a risk corresponding to the injection of very high currents in the low level electronic circuits which could destroy them.

To reduce this risk, an electrostatic shield, for example of the Faraday type, is used between the primary conductors and the measuring coils. This shield can be made of PCB via an additional copper layer. It is possible to choose whether or not to introduce a new time constant, taking into account the creation of eddy currents. For this purpose, the shields are etched in such a way that the eddy currents that may be generated are channeled wisely. Moreover, the conductivity of this shield must be controlled via its thickness or the use of striations in certain privileged directions in order to control the development of eddy currents in the shield. Electrostatic shields can be connected to a fixed potential, between the power and measurement layers, in order to divert parasitic currents judiciously.

The disclosure also relates to a sensor which senses the instantaneous rate of change of current which provides galvanic isolation, typically the rated isolation voltage is 1 kV or even 10 kV and breakdown voltages greater than 10 kV or even greater than 20 kV or even 50 kV.

It is sufficient to control the distance between the power and measurement circuits by using materials with a breakdown voltage corresponding to the desired objective. This is achieved in PCB technology with insulating materials, e.g. epoxy resins.

According to an embodiment, the disclosure relates to a sensor which senses the instantaneous rate of change of current immune to electromagnetic disturbances, in particular the crosstalk generated by the other bridge arms (case of a full bridge or a three-phase bridge for example). This is achieved via the differential structure of the measuring coils which reject all electromagnetic phenomena having a common mode between the two coils.

The invention claimed is:

1. A sensor configured to sense a rate of change of a current to protect bridge arms in a power module (PM) with power layers (PL) and measurement layers (ML), comprising at least three conductors (C1, C2, Cp) and coils, wherein:
   one end of each of said conductors is connected to a common node (N),
   and the other end of each of said conductors is used respectively each as an electrical terminal (T1, T2, Tp),
   said at least three conductors are contained in a same plane, called the primary plane (P),
   each conductor (C1, C2, Cp) has a plane of symmetry (P1, P2, Pp) perpendicular to the primary plane (P), each plane of symmetry passing through the common node (N) and the corresponding terminal (T1, T2, Tp),
   a first conductor (C1) and a second conductor (C2) are identical and positioned symmetrically with respect to a third conductor (Cp), and
   at least one pair of coils (10, 11 and/or 20, 21 and/or, 30, 31) are positioned symmetrically with respect to a plane of symmetry (P1, P2, Pp).

2. The sensor according to claim 1 wherein the first conductor (C1) and the second conductor (C2) are aligned, and the distance between the corresponding terminals (T1, T2) is minimal.

3. The sensor according to claim 1, wherein each of the coils of the third conductor (Cp) is constituted by one of the coils of the first conductor or the second conductor.

4. The sensor according to claim 1, wherein the conductors are in a rectilinear and flat shape.

5. The sensor according to claim 1, wherein the conductors are at least one of multilayer and striated.

6. The sensor according to claim 1, wherein the conductors have a "Roebel bar" type construction topology.

7. The sensor according to claim 1, wherein the conductors (C1, C2, Cp) and the coils are made of a multilayer printed circuit (MPC).

8. The sensor according to claim 1, further comprising electrostatic shields etched in a multilayer printed circuit and connected to a fixed potential (FP) between the power layers (PL) and the measurement layers (ML).

9. The sensor according to claim 8, wherein the shields are etched to selectively channel eddy currents.

10. A system comprising:
   a power module (PM) with power layers (PL) and measurement layers (ML); and
   a sensor according to claim 1 to sense a rate of change of a current to protect bridge arms in the power module (PM);
   wherein all of the power layers (PL) of the power module (PM) are gathered in a plane at a first level, and all of the measurement layers (ML) of the power module (PM) are gathered in a plane at a second level, the first level either above or below the second level.

* * * * *